US007082558B2

(12) United States Patent
Gupte et al.

(10) Patent No.: US 7,082,558 B2
(45) Date of Patent: Jul. 25, 2006

(54) INCREASING POSSIBLE TEST PATTERNS WHICH CAN BE USED WITH SEQUENTIAL SCANNING TECHNIQUES TO PERFORM SPEED ANALYSIS

(75) Inventors: Ajit D. Gupte, Pune (IN); Shankaranarayana Karantha Deshamangala, Krishnapura (IN); Amit Brahme, Pune (IN); Jais Abraham, Malapurram (IN)

(73) Assignee: Texas Instruments Incorporated, Dallas, TX (US)

( * ) Notice: Subject to any disclaimer, the term of this patent is extended or adjusted under 35 U.S.C. 154(b) by 575 days.

(21) Appl. No.: 10/302,886

(22) Filed: Nov. 25, 2002

(65) Prior Publication Data

US 2004/0103352 A1 May 27, 2004

(51) Int. Cl.
*G11C 29/00* (2006.01)
(52) U.S. Cl. .................. 714/718; 714/724; 714/726
(58) Field of Classification Search ................ 714/718, 714/55, 700, 741, 3, 7, 29, 30, 720, 721, 714/724, 726, 727, 728, 5
See application file for complete search history.

(56) References Cited

U.S. PATENT DOCUMENTS

| | | | | | |
|---|---|---|---|---|---|
| 4,366,478 | A | * | 12/1982 | Masuda et al. ............. 340/825 |
| 5,422,891 | A | * | 6/1995 | Bushnell et al. ............ 714/732 |
| 5,761,215 | A | * | 6/1998 | McCarthy et al. .......... 714/726 |
| 6,249,901 | B1 | * | 6/2001 | Yuan et al. ..................... 716/5 |
| 6,708,139 | B1 | * | 3/2004 | Rearick et al. ............. 702/185 |
| 2002/0147951 | A1 | * | 10/2002 | Nadeau-Dostie et al. ... 714/731 |
| 2003/0154433 | A1 | * | 8/2003 | Wang et al. ................. 714/726 |

OTHER PUBLICATIONS

Dervisoglu et al., Design for testability: using scanpath techniques for path-delay test and measurement, IEEE International Test Conference, Oct. 26-30, 1991, pp. 365-374.*
Puneet Gupta; Jais Abraham; Rubin A. Parekhji; Entitled: "Improving Path Delay Coverage in Embedded Cores-Methodology and Experiments"; TI India Technical Conference 2001; 9 pages.

* cited by examiner

*Primary Examiner*—Albert Decady
*Assistant Examiner*—Dipakkumar Gandhi
(74) *Attorney, Agent, or Firm*—Abdul Zindani; W. James Brady, III; Frederick J. Telecky, Jr.

(57) ABSTRACT

A non-robust test pattern, which causes a transition on a path of interest as well as off-paths, may be selected as being suitable for performing delay analysis of the path of interest (e.g., critical path) if the transitions caused on the off-paths would not overlap with the transition caused on the path of interest. In other words, an aspect of the present invention enables at least some non-robust test patterns to be used for performing delay analysis. As non-robust test patterns (as well as robust test patterns) can be used to perform delay analysis, the number of possible test patterns for performing speed analysis can be increased.

20 Claims, 5 Drawing Sheets

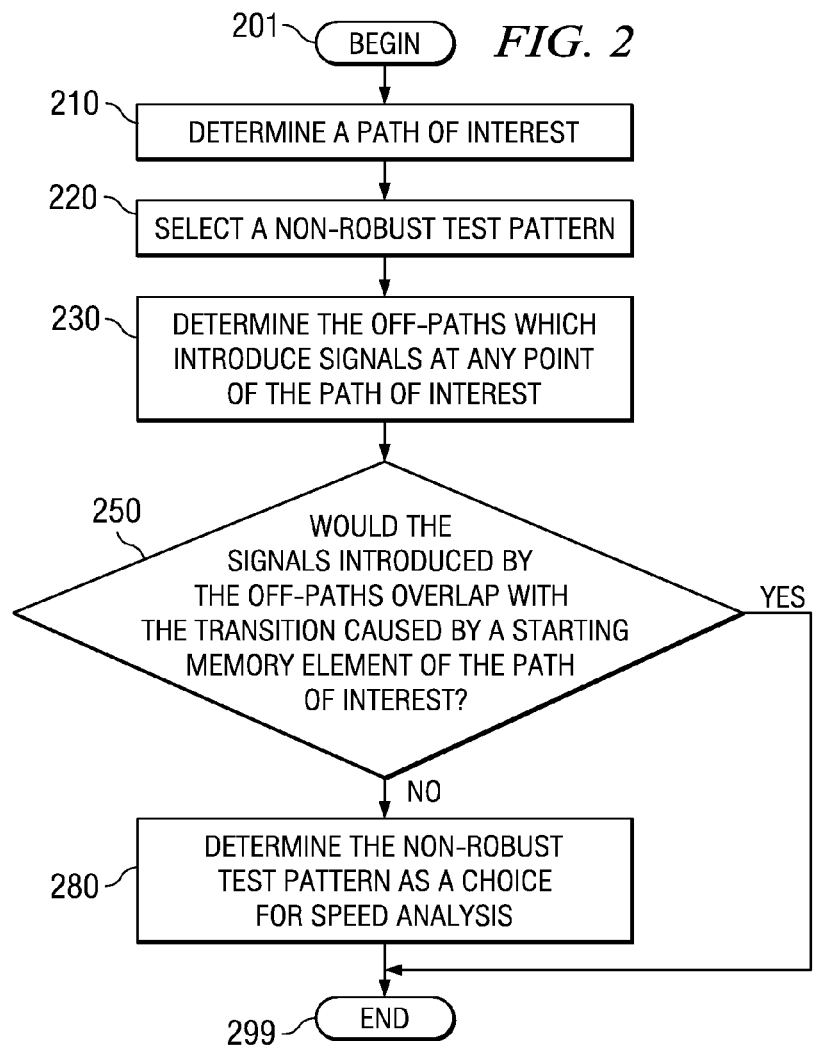
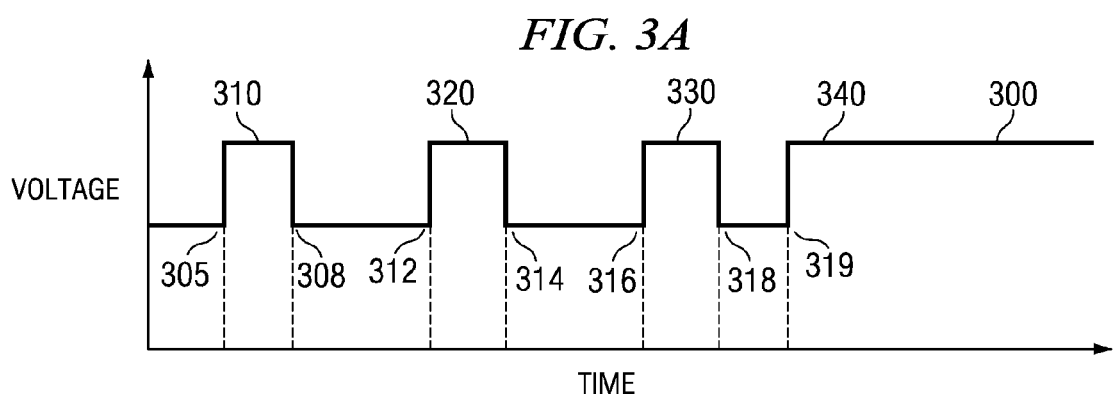

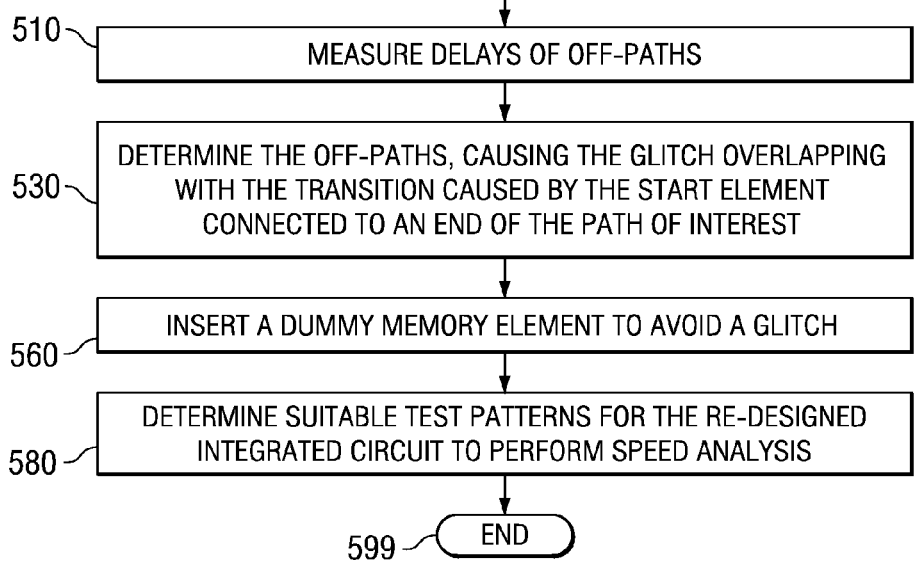
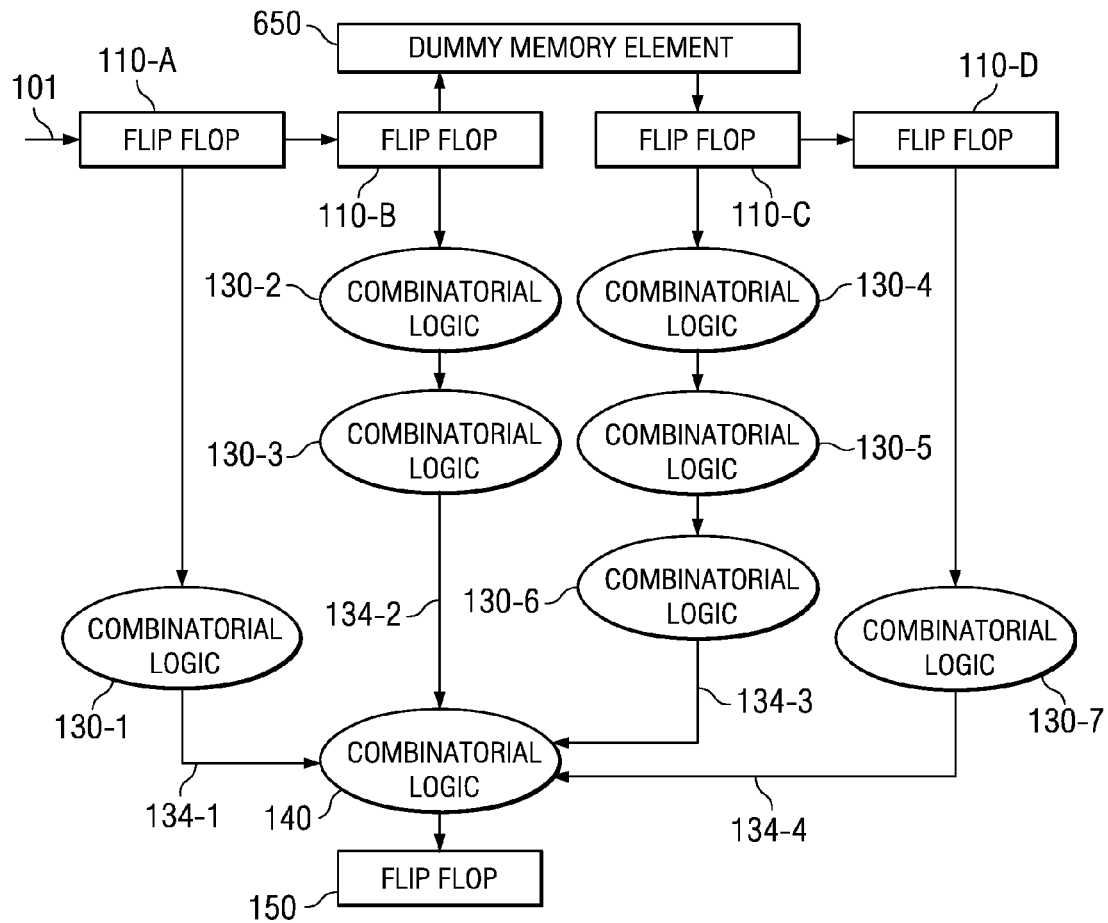

INCREASING POSSIBLE TEST PATTERNS WHICH CAN BE USED WITH SEQUENTIAL SCANNING TECHNIQUES TO PERFORM SPEED ANALYSIS

BACKGROUND OF THE INVENTION

1. Field of the Invention

The present invention relates to testing of integrated circuits, and more specifically to a method and apparatus for increasing possible test patterns which can be used with sequential scanning techniques to perform speed analysis.

2. Related Art

Speed analysis generally refers to measuring the delays which are encountered in receiving signals at the end of corresponding paths in integrated circuits. The measurements are usually performed to ensure that each generated signal is propagated (or reaches) to the corresponding ends of paths within any time limits as may be necessary for the operation of an integrated circuit at a specific clock frequency. Of particular concern are the specific path(s) which operate with longest delay(s), and the path is commonly referred to as a critical path.

Various approaches are known in the prior art to perform speed analysis. In one approach commonly referred to as functional testing, various bits (forming a test pattern) are provided on various inputs of an integrated circuit, and the outputs are examined for accurate functional operation of the circuit. In addition, the speed analysis may also be performed by measuring the time required to receive the outputs at the ends of the respective paths.

One problem with functional testing based approaches is that specific desired paths (e.g., critical path) may not be excited (signal generated at one end and propagated to another end of the path) with a set of test patterns. Accordingly the delays encountered on such paths may not be measured when only that set of test patterns are used. In addition, determination of a test pattern which would excite a specific desired path, may present challenges.

Sequential scanning techniques provides an alternative approach to perform speed analysis on specific paths. As is well known in the relevant arts, Delay Fault Automatic Test Pattern Generation (DFATPG) is an example of such a sequential scanning approach. In a typical scenario, the memory elements (e.g., flip-flops) are connected in sequence, and a desired sequence of bits ("test pattern") is sequentially scanned (scan order) into the memory elements.

The test pattern (and the circuit architecture) generally needs to be designed such that a serial shift of the test pattern in all the memory elements causes a transition (logical 0 to 1 or vice versa) on only a memory element connected at one end of a path of interest. As the content of the other memory elements may not change, the other memory elements may not affect the signal propagation on the path of interest, and the delay in the propagation of the transition over the path of interest may be reliably measured using DFATPG.

From the above, it may be appreciated that a DFATPG test pattern may need to be designed such that a shift of the test pattern changes the bit value of only desired specific memory element (connecting at one end of a critical path), and not others. A test pattern satisfying such a requirement may be referred to as a "robust test pattern" in the DFATPG environment.

Attempts have been made to design integrated circuits which satisfy the robustness requirement for test patterns in DFATPG approach. In one prior approach, the memory elements are connected in such a sequence that all the memory elements storing one logical value are connected in one direction of a subject memory element (coupled to an end of the critical path), and memory elements with another value are connected in the another direction.

One problem with such an approach is that the approach imposes (or requires) a specific order (scan order) in which the memory elements are to be connected, and the corresponding connectivity requirement may pose challenges in layout and routing while designing an integrated circuit. In addition, different test patterns may impose conflicting scan orders. Accordingly, the approach may not be suitable for at least some environments.

In another approach, which may not require connectivity of memory elements in scan order, an additional memory element ("dummy memory elements") may be used in the middle of sequence of memory elements, for example, to avoid undesirable changes in other memory elements which may affect the subject critical path.

As an illustration, it is assumed that a transition is desirable in one of the sequence of memory elements and such a transition can be attained by a shift operation. Assuming further that such a shift would shift-in an undesired value from one memory element to an adjacent memory element, a dummy memory element may be used in between the two elements. The dummy memory element can be pre-set to a value to ensure that the shift operation does not cause a transition in the adjacent memory element and thus retaining the off-path input.

However, one disadvantage of such an approach is that a large number of memory elements may be required to support, for example, excitation of various paths, and the resulting consumption of space (on the integrated circuit) and power consumption may be unacceptable.

Thus, it may be appreciated that the robustness requirement in DFATPG leads to various design constraints (e.g., routing in the first approach described above, and the need for dummy memory elements in the second approach) even when performing speed analysis on a single path of interest. The constraints are compounded when several paths need to be analyzed, as is often the case in design of complex integrated circuits.

A reason for the presence of such constraints is the small number of acceptable test patterns (for analyzing each path) forced by the robustness requirement in DFATPG. Accordingly, what is needed is a method and apparatus for increasing number of possible test patterns which can be used with sequential scanning techniques to perform speed analysis.

SUMMARY OF THE INVENTION

An aspect of the present invention enables the delay of a path of interest contained in an integrated circuit to be measured using non-robust test patterns, which cause transitions on a path of interest (having longest delay compared to the off-paths) as well as on off-paths connected to the path of interest. As non-robust test patterns also can be used to perform delay analysis, the number of test patterns which can be used to perform delay analysis is increased.

The path of interest may be located between a first start memory element and a target memory element, and an off-path may be located between a second start memory element and the path of interest. To determine whether a non-robust test pattern is suitable for performing delay analysis, the pattern is scanned into memory elements connected in sequence. The pattern is then shifted, which causes a respective transition in both the first start memory element and the off-path. The transitions are propagated towards the target memory element.

The non-robust test pattern is determined to be suitable (for performing delay analysis of the path of interest) only if the two transitions do not overlap. When such an overlap is not present, the receipt of transition caused by the first memory element can be identified at the target memory element, and the delay of the path of interest can be measured. In an embodiment, a critical path of an integrated circuit is treated as the path of interest, and the corresponding delay is measured to determine the highest frequency at which the integrated circuit can operate.

The feature(s) noted above can be used in designing integrated circuits. In one approach, a design of an integrated circuit is generated in digital format (e.g., in register transfer language). The critical path of the circuit may be determined using an appropriate tool. Test patterns (either robust or non-robust) may be determined which can be used to perform speed analysis on the circuit once fabrication of the integrated circuit is complete.

If no suitable test patterns are identified, dummy memory elements may be inserted next to a start memory element of an off-path which causes transitions overlapping with transitions on the critical path. Suitable test patterns may then be identified for the re-designed circuit. Once the integrated circuit is available in the form of hardware (e.g., on silicon), the identified test patterns may be used to perform delay analysis again.

Further features and advantages of the invention, as well as the structure and operation of various embodiments of the invention, are described in detail below with reference to the accompanying drawings. In the drawings, like reference numbers generally indicate identical, functionally similar, and/or structurally similar elements. The drawing in which an element first appears is indicated by the leftmost digit(s) in the corresponding reference number.

BRIEF DESCRIPTION OF THE DRAWINGS

The present invention will be described with reference to the accompanying drawings, wherein:

FIG. 2 is a flowchart illustrating a method using which a determination can be made as to whether a non-robust test pattern is suitable to perform speed analysis on a path of interest;

FIG. 3A is a timing diagram illustrating the ideal transitions at a target flip-flop due to transitions in start flip-flops of various paths in an example integrated circuit;

FIG. 5 is a flowchart illustrating an approach by which a glitch may be avoided in an embodiment according to the present invention;

FIG. 6 is a block diagram illustrating an approach for inserting dummy memory element to avoid glitch in an embodiment of the present invention.

DETAILED DESCRIPTION OF THE PREFERRED EMBODIMENTS

1. Overview and Discussion of the Invention

An aspect of the present invention enables a non-robust test pattern to be used to perform speed analysis on a path of interest (e.g., critical path) in a sequential scanning technique (e.g., DFATPG). Allowing the use of non-robust test patterns enhances the number of acceptable test patterns which may be used to test paths of interest. As a result, the design complexity of integrated circuits for speed analysis may be reduced.

In one embodiment described below, the determination of acceptable non-robust test patterns for a path of interest are identified by first determining off-paths which may introduce transitions at any point on the path of interest. If the signals introduced (on to the path of interest) by the off-paths in response to a non-robust test pattern, would not overlap with a transition resulting from a signal generated by an element (e.g., flip-flop) at one end of the path of interest, the non-robust test pattern may be deemed suitable for speed analysis (for the path of interest). Accordingly, such a non-robust test pattern may be chosen as a choice to perform speed analysis.

Several aspects of the invention are described below with reference to examples for illustration. It should be understood that numerous specific details, relationships, and methods are set forth to provide a full understanding of the invention. One skilled in the relevant art, however, will readily recognize that the invention can be practiced without one or more of the specific details, or with other methods, etc. In other instances, well-known structures or operations are not shown in detail to avoid obscuring the invention.

2. Example Circuit

Figure 1:
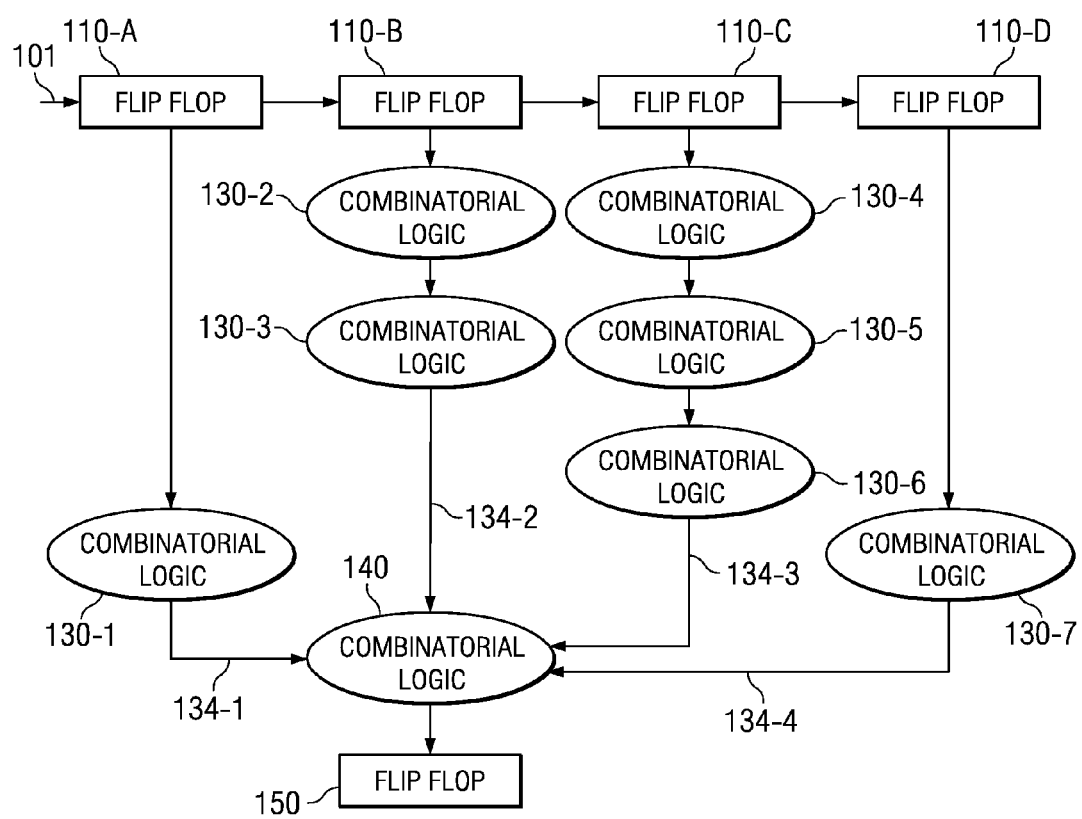
FIG. 1 is a block diagram illustrating an example circuit in which the present invention can be implemented.

FIG. 1 is a block diagram illustrating an example circuit in which the present invention can be implemented. The circuit includes input flip-flops 110-A through 110-D, combinatorial logics 130-1 through 130-7 and 140, and target flip-flop 150. Each component is described below in further detail.

Input flip-flops 110-A through 110-D, combinatorial logics 130-1 through 130-7 and 140, and target flip-flop 150 together represents the functional part of an example integrated circuit sought to be tested to perform speed analysis according to various aspects of the present invention. The functional part is shown containing four paths. Path one is shown containing input flip-flop 110-A and combinatorial logic 130-1. Path two is shown containing input flip-flop 110-B and combinatorial logics 130-2 and 130-3. Path three is shown containing input flip-flop 110-C and combinatorial logics 130-4, 130-5 and 130-6, and path four is shown containing input flip-flop 110-D and combinatorial logic 130-7.

Flip-flops 110-A through 110-D are shown connected sequentially. Flip-flop 110-A is shown receiving inputs on path 101. In general, a sequence of bits forming a test pattern is scanned into flip-flops 10-A by providing the bits sequentially on path 101. The test pattern is shifted by one position (while providing another bit on path 101). A change in the stored value in any of the flip-flops 110-A through 110-D causes a transition in the corresponding paths.

Combinatorial logics 130-1 and 130-7 in paths one and four respectively receive the bit stored in input flip-flops 110-A and 110-D and generate a corresponding output on paths 134-1 and 134-4. Combinatorial logics 130-2 and 130-3 in path two together operate on a bit stored in input flip-flop 110-B and generate a corresponding output on path 134-2. Similarly, combinatorial logics 130-4, 130-5 and 130-6 in path three together operate on a bit stored in input flip-flop 110-C and generate a corresponding output on path 134-3. While each of the combinatorial logics 130-1 through 130-7 are shown only with one input for illustration, typical logic circuits contain several more inputs.

Combinatorial logic 140 in turn receives the four output bits on paths 134-1 through 134-4 and generates a bit, which is stored in target flip-flop 150. The four output bits on paths 134-1 through 134-4 may not transition at the same time due to different delays provided by combinatorial logics 130-1 through 130-4.

The delay imposed by each of the four paths for propagating a bit to target flip-flop 150 may be different. For example, path three contains three combinatorial logics which may impose more delay compared to the other paths. Accordingly, path three forms a critical path, which is assumed to be a path of interest for performing speed analysis.

The description is continued with reference to performing speed analysis of path three ("critical path") for illustration. However, various aspects of the present invention can be used to perform speed analysis on other paths as well. In addition, paths one, two and four are connected to the path of interest, and may thus introduce signal transitions on to the path of interest, i.e., path three. Paths one, two and four, which can introduce signal transitions onto a path of interest, are referred to as off-paths.

The manner in which the delay of the critical path may be measured according to various aspects of the present invention is described in sections below. First the manner in which the number of non-robust test patterns suitable for performing speed analysis, may be increased is described below with reference to FIG. 2.

3. Method

FIG. 2 is a flowchart illustrating a method by which a determination can be made as to whether a non-robust test pattern may be selected to perform speed analysis. The method is described with reference to FIG. 1 for illustration. However, the method can be implemented in other embodiments without departing from the scope and spirit of the present invention, as will be apparent to one skilled in the relevant arts based on the disclosure provided herein. The method begins in step 201 in which control passes to step 210.

In step 210, a path of interest is determined. A path having the longest delay in comparison to any intersecting off-paths is chosen as a path of interest. For example, a critical path providing longest delay in an integrated circuit may be determined to be a path of interest. In an embodiment, a tool performing static timing analysis generates data (e.g., in the form of a file) indicating the critical path in an integrated circuit. Accordingly such data may merely need to be examined to determine the path of interest.

In step 220, a non-robust test pattern is selected to perform speed analysis. The steps below can be used to determine whether the selected test pattern is suitable for measuring the delay of the path of interest, as described below. In step 230, the off-path(s) which may introduce signals at any point of the path of interest is determined. The determination of the off-paths may be performed by examining various representations (e.g., netlist) of an integrated circuit design. With reference to FIG. 1, paths one, two and four represent the off-paths for the path of interest, path three.

In step 250, a determination is made as to whether the signals introduced by the off-paths would not overlap with transitions caused by a starting memory element of the path of interest. In an embodiment implemented substantially in the form of software, a circuit simulator (SPICE simulator, well known in the relevant arts) is extended to generate digital values representing an output signal received by the target memory element. The digital values can be examined to determine whether an overlap is present.

In the illustrative example, flip-flop 110-C represents the starting memory element of the path of interest. The non-robust test pattern in such a situation would be suitable for speed analysis. Accordingly control passes to step 280, in which the non-robust test pattern selected in step 220 is chosen as a choice to perform speed analysis, and control passes to step 299.

If the signals introduced by the off-paths would overlap with the transition caused by the starting memory element of the path of interest, the non-robust test pattern is discarded, and control passes to step 299. Steps 220 through 280 may be repeated for each test pattern. The method ends in step 299.

From the above, it may be appreciated that a non-robust test pattern may be determined to be suitable to perform speed analysis if the signals introduced by off-paths would not overlap with the transitions caused by a starting element of the path of interest. The basis for such a proposition is illustrated in further detail below with reference to FIGS. 3A and 3B.

4. Timing Diagrams

Figure 3B:
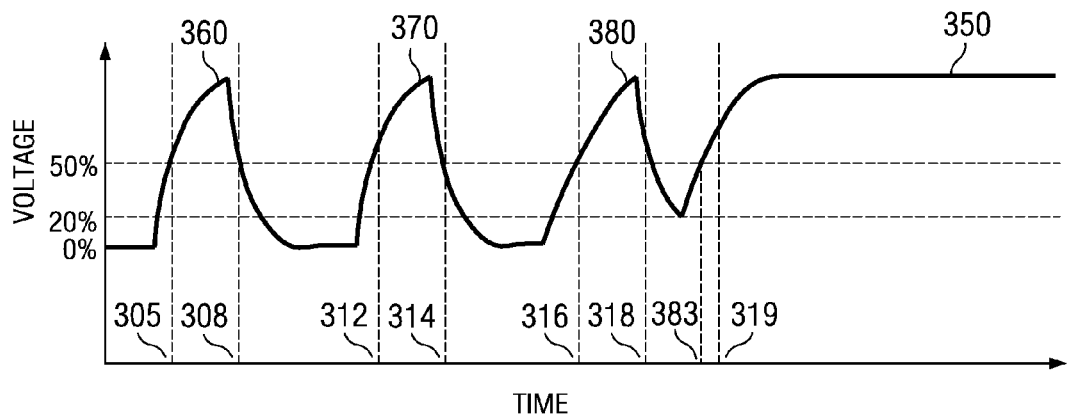
FIG. 3B is a timing diagram illustrating the actual transitions at a target flip-flop due to transitions in start flip-flops of various paths in the example integrated circuit.

FIGS. 3A and 3B are timing diagrams illustrating the manner in which a determination can be made as to whether a specific non-robust test pattern is suitable for performing speed analysis of a path of interest. The diagrams are described with reference to the four paths noted above with reference to FIG. 1. It is assumed for illustration that a test pattern is scanned to cause transitions on all the four flip-flops 110-A through 110-D.

FIG. 3A is a timing diagram illustrating the signal (voltage) level (line 300) on path connecting combinatorial logic 140 and flip-flop 150 assuming that each of the start flip-flops (110-A through 110-D) generate ideal transitions on corresponding paths to flip-flop 150. Portions 310 (between time points 305 and 308), 320 (between time points 312 and 314), 330 (between time points 316 and 318) and 340 (from time point 319) respectively represents the ideal transitions due to a change in bit values of flip-flops 110-A, 110-D, 110-B and 110-C respectively.

The delay caused by the paths containing flip-flops 110-A and 110-D is assumed to be short, thus the corresponding transitions are shown propagated earlier to target flip-flop 150 as shown at portions 310 and 320. However, the delay caused by the path containing flip-flop 110-B is assumed to be long, and hence the transition is shown propagated after a long time represented by portion 330. The critical path containing flip-flop 110-C may provide large delay than the off-paths. Thus, the transition at flip-flop 110-C is shown propagated after a long time represented by time point 319.

As may be readily observed, the transitions propagated due to flip-flops 110-A, 110-B and 110-D to target flip-flop 150 may subside before the transition due to flip-flop 110-C is propagated (as represented by time duration between time points 318 and 319). As a clear transition is encountered at time point 319, the time consumed for the transition to be propagated to target flip-flop 150 through the critical path may be measured, and thus in the ideal case of FIG. 3A, the corresponding non-robust test pattern may be deemed to be suitable for performing speed analysis of path three (critical path).

However, the transitions from one logical value to another logical value may not practically occur instantaneously (as shown in FIG. 3A) due to charging/discharging of capacitances inherently present in the paths. The manner in which such realistic transitions affect a determination of suitability of non-robust test patterns for speed analysis is described below with reference to FIG. 3B.

FIG. 3B is a timing diagram illustrating the actual transitions at target flip-flop 150 due to transitions in flip-flops 110-A through 110-D. The actual transitions may occur slowly as represented by line 350. Portions 360 and 370 respectively represents the actual transitions that are propagated due to flip-flops 110-A and 110-D. It may be observed that the actual transitions due to flip-flops 110-A and 110-D cross 50% level (of voltage representing logical high, percentages not to scale in FIG. 3B) at time points 305 and 312 representing start of ideal transitions of portions 310 and 320 respectively.

Portions 360 and 370 are shown subsiding (reach small voltage level) before the transition at flip-flop 110-C is propagated through the critical path due to short delay of paths containing flip-flops 110-A and 110-D. Therefore, portions 360 and 370 do not overlap with the transition caused by the path of interest (critical path, path three).

However, portion 380 is shown not subsiding by the time the transition due to flip-flop 110-C is propagated to target flip-flop 150. The node at target flip-flop 150 due to transition caused by flip-flop 110-B is not discharged completely but is at 20% level by the time the transition due to flip-flop 110-C is propagated. Therefore, the actual transition due to flip-flop 110-C adds the charge to the 20% level and causes a transition at target flip-flop 150.

It may be observed that the actual transition due to flip-flop 110-C crosses 50% level earlier at time point 383 than the ideal transition shown by portion 340 at time point 319 due to the overlap of portion 380 with the transition caused by flip-flop 110-C. A glitch is said to be present when a transition due to an off-path overlaps with the transition caused by a start memory element on the path of interest.

Therefore, time delay measured for the completion of transition at target flip-flop 150 due to critical path may not accurately reflect the time delay introduced by the critical path (when transitions due to off-path(s) overlap with the transition due to a path of interest). However, when no such overlap exists, the non-robust test pattern may be used for speed analysis.

In addition, while the overlap of off-paths is shown at the end (combinatorial logic 140) of the critical path (path three), it should be appreciated that the approaches described herein can be used irrespective of the point at which the off-paths intersect with a path of interest.

Thus, using the approaches/techniques described above, various products/methods can be implemented to perform speed analysis. The description is continued with reference to an example approach.

5. Speed Analysis

Figure 4:
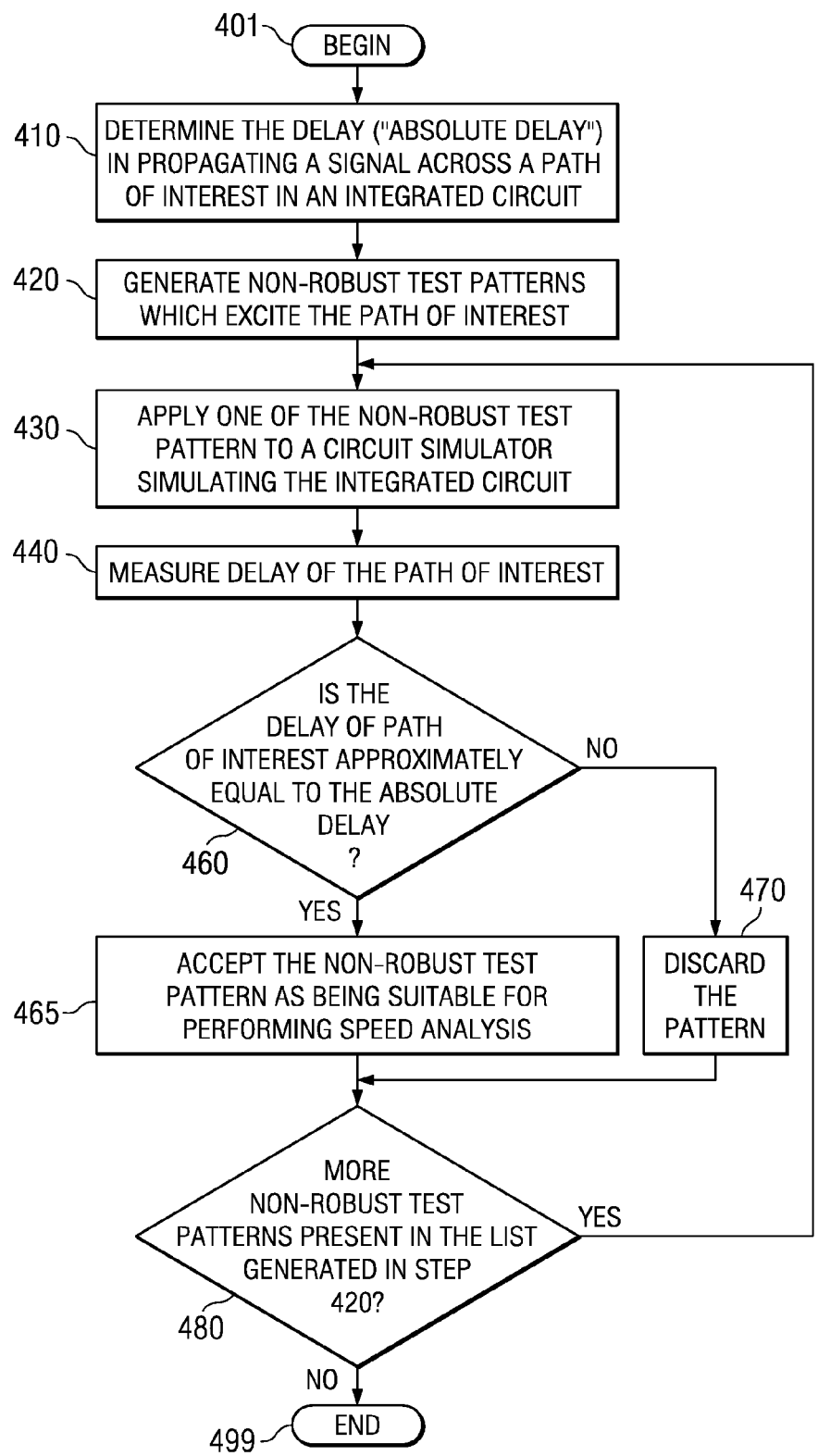
FIG. 4 is a flowchart illustrating the method using which a non-robust test pattern may be used to perform speed analysis.

FIG. 4 is a flowchart illustrating the method by which non-robust test patterns suitable for performing speed analysis may be determined. The method begins in step 401 in which control passes to step 410.

In step 410, the delay ("absolute delay") in propagating a signal across a path ("path of interest") of an integrated circuit is determined. In an embodiment, the absolute delay is determined using a circuit simulator (e.g., SPICE simulator), which provides an accurate measure of the delay.

In step 420, non-robust test patterns which excite the critical path are generated. In one embodiment, the non-robust test patterns are generated using a automatic test pattern generation (ATPG) tool entitled, "Fastscan", available from Mentor Graphics Corp., California, USA.

In step 430, one of the non-robust test patterns is applied to a circuit simulator simulating the integrated circuit. The circuit simulator receives the non-robust test pattern, provides the pattern as an input to the integrated circuit, and generates output signals at target memory element. In an embodiment, SPICE simulator, well known in the relevant arts, may be used to simulate the integrated circuit.

In step 440, the delay of the critical path is measured. In an embodiment, the delay of the critical path is measured by measuring the time delay between the transition applied (or caused by shifting the test pattern) at a start memory element and the transition caused at a target memory element at the end of the critical path.

In step 460, a determination is made as to whether the delay of the critical path is approximately equal to the absolute delay (measured in step 410). If the delay is approximately equal, it may be assumed that a transition caused by an off-path does not overlap with the transition caused by the start memory element of the critical path. If the condition of step 460 is satisfied, control passes to step 465. In step 465, the non-robust test pattern is selected as being suitable for performing speed analysis, and control passes to step 480.

If the condition of step 460 is not satisfied, control passes to step 470. In step 470, the non-robust test pattern is discarded and control then passes to step 480. In step 480, a determination is made as to whether more non-robust test patterns are present in the list generated in step 420. If more non-robust test patterns are remaining, control passes to step 430, in which a new test pattern from the list is examined in steps 430–480 as described above. Otherwise, control passes to step 499. The method ends in step 499.

From the above, it may be appreciated that a list of non-robust test patterns suitable for performing speed analysis may be determined. In addition, while the path of interest is described as being a critical path, it should be understood that any path having the longest delay among the paths which are excited, can be used as a path of interest. In other words, a non-critical path can be used as a path of interest if the paths of longer delay (including critical path) are not excited (absence of transition) by a non-robust test pattern, the non-critical path can be used a path of interest.

The patterns thus determined can be applied to silicon testing, i.e., testing of the integrated circuits implemented in hardware. The results of silicon testing may be correlated with the results generated by STA (static timing) analysis and/or simulation performed at least with reference to the critical paths.

However, it is possible that none of the non-robust test patterns are determined to be suitable (using the approaches described above) for performing speed analysis. In such a situation, the integrated circuit may need to be re-designed and suitable test patterns determined, for example, as described below with reference to FIG. 5.

6. Re-Design

FIG. 5 is a flowchart illustrating a method by which an integrated circuit may be re-designed, which presents more choices of test patterns. The approach may be used when no test patterns are determined to be suitable for performing speed analysis using the approaches described above. The method starts in step 501, in which control passes to step 510.

In step 510, the delays of off-paths are measured. In an embodiment, the delay of each off-path is measured by applying a transition only on the starting memory element of the corresponding off-path and measuring the time delay for the transition to be propagated to the target memory element at the other end of the off-path.

In step 530, the off-paths, causing the glitch overlapping with the transition caused by the start element connected to an end of the path of interest, are determined. The off-path(s) ("glitch-path(s)") with a delay value close to the absolute delay of the critical path may cause the undesirable glitch (es).

In step 560, a dummy memory element is inserted to avoid a glitch. In an embodiment, the dummy memory element is inserted after the starting memory element of the glitch-path(s). The dummy memory element is initialized with a value required to initialize the next memory element in the scan order. In addition, the starting memory element of the glitch-path(s) may store initially a same bit value as that would be received when the test pattern is shifted by one position.

In step 580, suitable test patterns to perform speed analysis are determined for the redesigned circuit. Both robust and non-robust test patterns may be determined to be suitable for the speed analysis. The non-robust test patterns may be determined according to the approaches described above with reference to FIGS. 2–4. The method ends in step 599. An example embodiment in which the dummy memory element is inserted to avoid glitches is described below with reference to FIG. 6.

7. Dummy Memory Element

FIG. 6 is a block diagram illustrating an approach for inserting dummy memory element to avoid glitch in an embodiment of the present invention. For illustration, it is assumed that path two of FIG. 1 is an off-path which causes a glitch for all non-robust test patterns. Accordingly, the circuit of FIG. 1 is modified to include dummy memory element 650 after flip-flop 110-B (the start memory element for path two). The modified circuit is shown in FIG. 6.

Dummy memory element 650 is initialized to a bit value that would be required by flip-flop 110-C upon performance of the shift operation. As a transition is required in flip-flop 110-C upon performance of the shift operation, dummy memory element 650 may initially (before shift) store a bit value which is different from a bit value stored in flip-flop 110-C. As a result, when a shift operation is performed, a transition would be propagated on path three (critical path/path of interest).

Flip-flop 110-B (the start memory element of the off-path causing the glitch) initially stores the same bit value as that would be shifted from the previous flip-flop 110-A. As a result, when a test pattern is shifted, no transition would result on off-path (path two) that may have otherwise caused the glitch.

Accordingly, when suitable test patterns cannot be determined for a specific design on an integrated circuit, dummy memory elements may be introduced to increase the number of possible test patterns which can be used for speed analysis. However, it is often desirable to minimize the number of dummy memory elements used in controlling the values in flip-flops. Accordingly, a designer may determine the specific paths/memory elements where control is desirable, and implement dummy memory elements associated with only the corresponding flip-flops.

Several/all of the steps/approaches described above may be implemented in the form of a software to quickly perform various tasks described above. An example environment in which the present invention may be implemented is described below with reference to FIG. 7.

8. Example Environment

Figure 7:
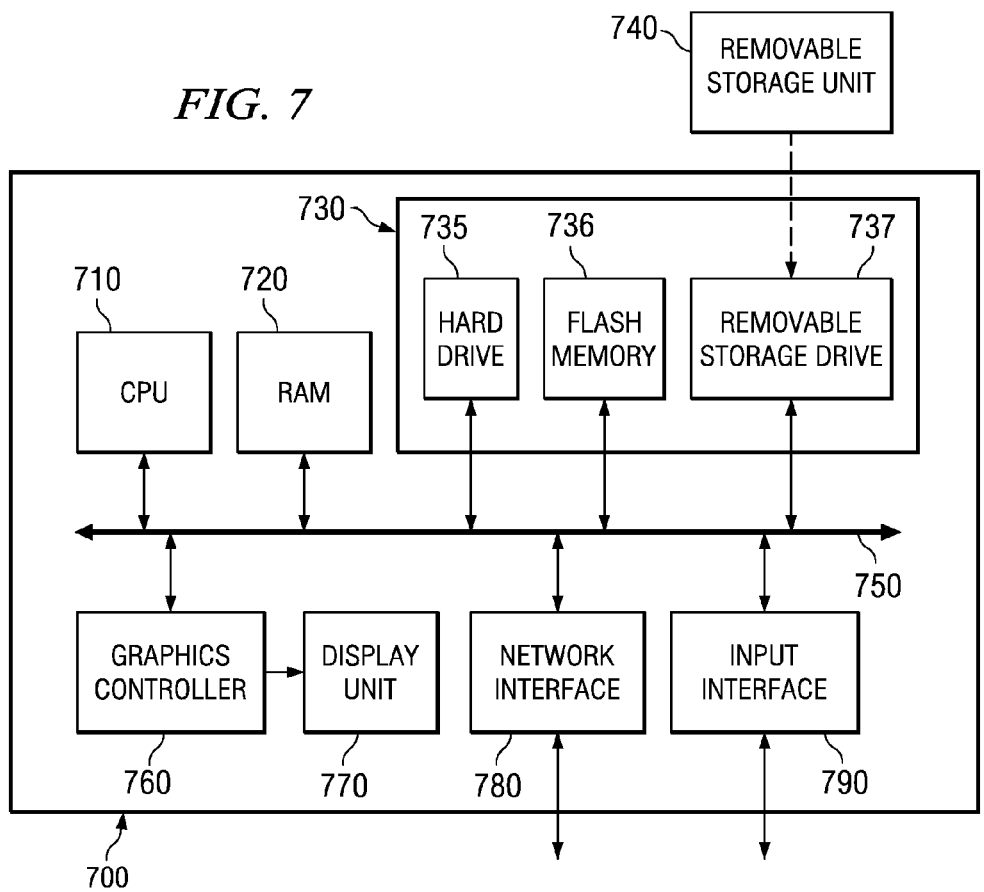
FIG. 7 is a block diagram of a computer system illustrating an example environment for implementing the present invention.

FIG. 7 is a block diagram of computer system 700 illustrating an example environment for implementing various aspects of the present invention. Even though computer system 700 is described with specific components and architectures for illustration, it should be understood that the present invention may be implemented in several other types of embodiments.

Computer system 700 may contain one or more processors such as central processing unit (CPU) 710, random access memory (RAM) 720, secondary memory 730, graphics controller 760, display unit 770, network interface 780, and input interface 790. All the components except display unit 770 may communicate with each other over communication path 750, which may contain several buses as is well known in the relevant arts. The components of FIG. 7 are described below in further detail.

CPU 710 may execute instructions stored in RAM 720 to provide several features of the present invention. CPU 710 may contain multiple processing units, with each processing unit potentially being designed for a specific task. Alternatively, CPU 710 may contain only a single processing unit. RAM 720 may receive instructions from secondary memory 730 using communication path 750.

Graphics controller 760 generates display signals (e.g., in RGB format) to display unit 770 based on data/instructions received from CPU 710. Display unit 770 contains a display screen to display the images defined by the display signals. Input interface 790 may correspond to devices such as key-board, mouse, and various interfaces (e.g., RS-232, USB) which enables various types of data to be provided from an external source.

Network interface 790 may be implemented using protocols such as TCP/IP, ATM and/or Ethernet. In an embodiment, network interface 780 and/or input interface 790 enable data to be received from external programs such as SPICE simulator STA Tool. The data thus received may be processed by CPU 710 by executing various instructions to provide various features of the present invention. The interfaces can be used to provide data to such external programs as well.

Secondary memory 730 may contain hard drive 735, flash memory 736 and removable storage drive 737. Secondary storage 730 may store the software instructions and data (e.g., output/files generated by external programs), which enable computer system 700 to provide several features in accordance with the present invention. Some or all of the data and instructions may be provided on removable storage unit 740, and the data and instructions may be read and provided by removable storage drive 737 to CPU 710. Floppy drive, magnetic tape drive, CD-ROM drive, DVD Drive, Flash memory, removable memory chip (PCMCIA Card, EPROM) are examples of such removable storage drive 737.

Removable storage unit 740 may be implemented using medium and storage format compatible with removable storage drive 737 such that removable storage drive 737 can read the data and instructions. Thus, removable storage unit 740 includes a computer usable storage medium having stored therein computer software and/or data. An embodiment of the present invention is implemented using software running (that is, executing) in computer system 700.

In this document, the term "computer program product" is used to generally refer to removable storage unit 740 or hard disk installed in hard drive 735. These computer program products are means for providing software to computer system 700. As noted above, CPU 710 may retrieve the software instructions, and execute the instructions to provide various features of the present invention. The features of the present invention are described above in detail.

9. Conclusion

While various embodiments of the present invention have been described above, it should be understood that they have been presented by way of example only, and not limitation. Thus, the breadth and scope of the present invention should not be limited by any of the above described exemplary embodiments, but should be defined only in accordance with the following claims and their equivalents.

What is claimed is:

1. A method of measuring a delay of a path of interest contained in an integrated circuit, said integrated circuit comprising a plurality of memory elements and a plurality of combinatorial blocks forming a plurality of paths, wherein said plurality of paths comprise said path of interest and wherein said path of interest has a longest delay in said plurality of paths, said path of interest being located between a first start memory element and a target memory element, said plurality of memory elements being connected in sequence, said method comprising:
scanning-in a non-robust test pattern into said plurality of memory elements;
shifting said non-robust test pattern, wherein said shifting of said non-robust test pattern causes a transition to occur in both of said first start memory element and a second start memory element, wherein said second start memory element is at one end of an off-path intersecting with said path of interest, wherein said second start memory element is also comprised in said plurality of memory elements; and
measuring said delay of said path of interest by examining a signal received at said target memory element, said signal containing said transition propagated from both of said first start memory element and said second start memory element, wherein said signal is generated in response to said shifting.

2. The method of claim 1, further comprises determining whether said non-robust test pattern is suitable for said measuring of said delay, said detennining comprises:
checking whether said transition propagated from said second start memory element would overlap with said transition propagated from said first start memory element; and
concluding that said non-robust test patterns is suitable for said measuring only if an overlap is determined to be absent in said checking.

3. The method of claim 2, wherein said path of interest comprises a critical path of said integrated circuit.

4. The method of claim 3, further comprising:
receiving a plurality of non-robust test patterns which are possibly suitable for said measuring; and
performing elements of claim 2 to determine whether each of said plurality of non-robust test patterns is actually suitable for said measuring.

5. The method of claim 4, wherein said measuring is performed first using a data representation of said integrated circuit to determine said non-robust test patterns, and wherein said scanning, said shifting and said measuring are performed on said integrated circuit provided in the form of hardware.

6. The method of claim 5, wherein said critical path is determined by performing static timing analysis of said data representation of said integrated circuit.

7. The method of claim 6, further comprising determining said off-path by examining a gate-level representation of said integrated circuit.

8. The method of claim 4, further comprising inserting a dummy memory element next to said second start memory element if none of said plurality of test patterns is determined to be suitable for said measuring.

9. The method of claim 8, further comprising:
scanning-in a second non-robust test pattern into said plurality of memory elements including said dummy memory element, wherein said second non-robust test pattern is designed to prevent a transition on said off-path; and
measuring said delay of said path of interest by examining another signal received at said target memory element.

10. A method of determining whether a non-robust test pattern is suitable for measuring a delay of a path of interest, said path of interest being contained in an integrated circuit, said integrated circuit comprising a plurality of memoty elements and a plurality of combinatorial blocks forming a plurality of paths, said plurality of memory elements being connected in sequence, wherein said plurality of paths comprise said path of interest and an off-path, said path of interest having more delay than said off-path, said path of interest being located between a first start memory element and a target memory element, said off-path being located between a second start memory element and said path of interest, wherein scanning in said non-robust test pattern into said plurality of memory elements and then performing a shift causes a first transition to occur rn said first memory element and a second transition to occur in said second memory element, said method comprising:
determining whether said second transition propagated to said target memory element overlaps with said first transition propagated to said target memory element; and
selecting said non-robust test pattern as being suitable for measuring said delay of said path of interest if said determining determines that there is no overlap.

11. The method of claim 10, wherein said path of interest comprises a critical path of said integrated circuit.

12. A computer readable medium carrying one or more sequences of instructions for enabling a system to measure a delay of a path of interest contained in an integrated circuit, said integrated circuit comprising a plurality of memory elements and a plurality of combinatorial blocks forming a plurality of paths, wherein said plurality of paths comprise said path of interest and wherein said path of interest has a longest delay in said plurality of paths, said path of interest being located between a first start memory element and a target memory element, said plurality of memory elements being connected in sequence, wherein execution of said one or more sequences of instructions by one or more processors contained in said system causes said one or more processors to perform the actions of:
scanning-in a non-robust test pattern into said plurality of memory elements;
shifting said non-robust test pattern, wherein said shifting of said non-robust test pattern causes a transition to occur in both of said first start memory element and a second start memory element, wherein said second start memory element is at one end of an off-path intersecting with said path of interest, wherein said second start memory element is also comprised in said plurality of memory elements; and
measuring said delay of said path of interest by examining a signal received at said target memory element, said signal containing said transition propagated from both of said first start memory element and said second start memory element, wherein said signal is generated in response to said shifting.

13. The computer readable medium of claim 12, further comprises determining whether said non-robust test pattern is suitable for said measuring of said delay, said determining comprises:

checking whether said transition propagated from said second start memory element would overlap with said transition propagated from said first start memory element; and concluding that said non-robust test patterns is suitable for said measuring only if an overlap is determined to be absent in said checking.

14. The computer readable medium of claim 13, wherein said path of interest comprises a critical path of said integrated circuit.

15. The computer readable medium of claim 14, further comprising:

receiving a plurality of non-robust test patterns which are possibly suitable for said measuring; and performing elements of claim 13 to determine whether each of said plurality of non-robust test patterns is actually suitable for said measuring.

16. The computer readable medium of claim 15, wherein said measuring is performed first using a data representation of said integrated circuit to determine said non-robust test patterns, and wherein said scanning, said shifting and said measuring are performed on said integrated circuit provided in the form of hardware.

17. The computer readable medium of claim 16, wherein said critical path is determined by performing static timing analysis of said data representation of said integrated circuit.

18. The computer readable medium of claim 17, further comprising determining said off-path by examining a gate-level representation of said integrated circuit.

19. A computer readable medium carrying one or more sequences of instructions for enabling a system to determine whether a non-robust test pattern is suitable for measuring a delay of a path of interest, said path of interest being contained in an integrated circuit, said integrated circuit comprising a plurality of memory elements and a plurality of combinatorial blocks forming a plurality of paths, said plurality of memory elements being connected in sequence, wherein said plurality of paths comprise said path of interest and an off-path, said path of interest having more delay than said off-path, said path of interest being located between a first start memory element and a target memory element, said off-path being located between a second start memory element and said path of interest, wherein scanning in said non-robust test pattern into said plurality of memory elements and then performing a shift causes a first transition to occur in said first memory element and a second transition to occur in said second memory element, wherein execution of said one or more sequences of instructions by one or more processors contained in said system causes said one or more processors to perform the actions of:

determining whether said second transition propagated to said target memory element overlaps with said first transition propagated to said target memory element, and selecting said non-robust test pattern as being suitable for measuring said delay of said path of interest if said determining determines that there is no overlap.

20. The computer readable medium of claim 19, wherein said path of interest comprises a critical path of said integrated circuit.

* * * * *